United States Patent
Melanson et al.

(10) Patent No.: US 7,262,717 B2
(45) Date of Patent: Aug. 28, 2007

(54) SAMPLE RATE CONVERSION COMBINED WITH FILTER

(75) Inventors: John L. Melanson, Austin, TX (US); Stephen Alan Turk, Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/387,093

(22) Filed: Mar. 22, 2006

(65) Prior Publication Data

US 2007/0146177 A1 Jun. 28, 2007

Related U.S. Application Data

(63) Continuation-in-part of application No. 11/318,271, filed on Dec. 23, 2005.

(51) Int. Cl.
*H03M 7/00* (2006.01)

(52) U.S. Cl. ........................................... 341/61; 341/60

(58) Field of Classification Search ............. 341/50–80
See application file for complete search history.

(56) References Cited

U.S. PATENT DOCUMENTS

| | | | |
|---|---|---|---|
| 5,500,874 A | | 3/1996 | Terrell |
| 5,815,102 A | | 9/1998 | Melanson |
| 5,944,775 A | * | 8/1999 | Satoshi ........................ 708/603 |
| 6,150,969 A | | 11/2000 | Melanson |
| 6,215,429 B1 | * | 4/2001 | Fischer et al. ............... 341/139 |
| 6,480,129 B1 | | 11/2002 | Melanson |
| 7,129,861 B2 | * | 10/2006 | Avantaggiati ................ 341/61 |

OTHER PUBLICATIONS

"Design of IIR Filters" (Samir V. Ginde & Joseph A.N. Noronha), Virginia Polytechnic and State University, (www.ee.vt.edu/~jnoronha/dsp_proj2_report.pdf), undated.
"Infinite Impulse Response"(http://en.wikipedia.org/wiki/Infinite_impulse_response) from Wikipedia, the free encyclopedia, undated.

* cited by examiner

*Primary Examiner*—Lam T. Mai
(74) *Attorney, Agent, or Firm*—Robert Platt Bell; Steven A. Lin

(57) ABSTRACT

Digital filtering and sample rate conversion blocks are combined in order to reduce hardware and/or computational complexity. Input data samples provided at a first sample rate are converted to output data samples at a second sample rate unequal to the first sample rate. An Infinite Impulse Response filter having internal states are updated at the first sample rate filters the input data samples in, to produce filtered data samples at the first sample rate. Output data samples are output at the second sample rate, where each output data sample is created as the sum of at least two intermediate products, a first intermediate product and a second intermediate product. The first intermediate product is defined by a first function of the internal states multiplied by a first function of the time difference between output samples and internal state updates, and the second intermediate product is defined by a second function of the internal states multiplied by a second function of the time difference between output samples and internal state updates.

20 Claims, 11 Drawing Sheets

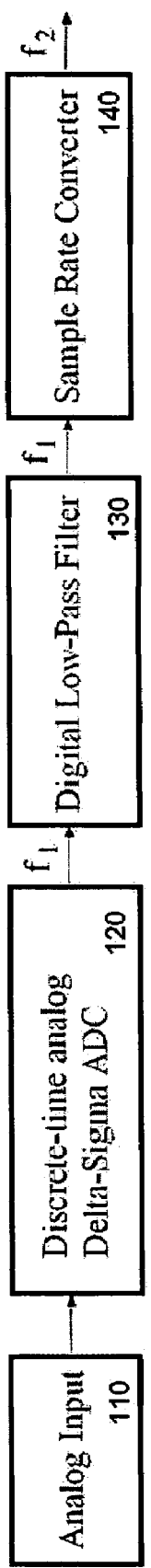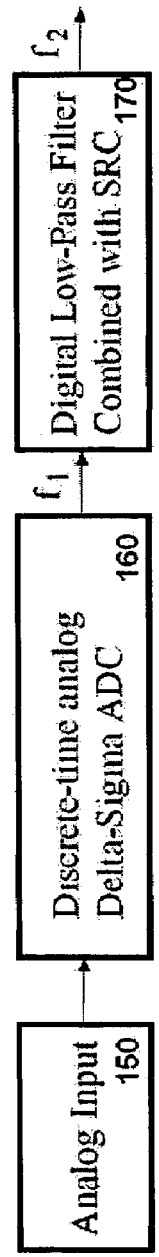
Figure 1 (Prior Art)
Figure 2

SAMPLE RATE CONVERSION COMBINED WITH FILTER

CROSS-REFERENCE TO RELATED APPLICATIONS

The present application is a Continuation-In-Part (CIP) of co-pending U.S. patent application Ser. No. 11/318,271 filed on Dec. 23, 2005, and incorporated herein by reference.

FIELD OF THE INVENTION

The present invention describes a method of combining sample rate conversion with an ADC. Specifically, the present invention adds sample rate conversion to a digital low-pass filter that follows a noise shaping delta-sigma ADC. More generally, the present invention is useful anytime a digital low-pass filter is already required by the system, because the sample rate conversion can be combined with the low-pass filter, thus reducing hardware or software computation requirements.

BACKGROUND OF THE INVENTION

FIG. 1 illustrates the traditional way of sample rate conversion as a separate block in an Analog to Digital Converter (ADC). Specific digital sampling frequencies are indicated via $f_1$ and $f_2$. Analog input 110 may be input to discrete-time analog Delta-Sigma ADC 120, outputting digital data at a first sampling frequency $f_1$. Digital low-pass filter 130 may remove unwanted components from the digital data, which is then sent to a sample rate converter 140, which outputs the digital data at a second (desired) sampling frequency $f_2$. As illustrated in FIG. 1, this Prior Art approach requires separate components for the sample rate conversion and also for the ADC. Moreover, traditional sample-rate conversion techniques can be cumbersome and difficult to implement.

Frequency domain effects of sample rate conversion can be analyzed by upsampling the original digital samples by an integer M, and then downsampling that sequence by N. For example, if $f_2=0.8f_1$, then upsampling by M=4 and then downsampling by N=5 gives the desired sample rate transformation. FIGS. 3-7 illustrate the process in the frequency domain. (The dots indicate that the images are repeated, but only the ones of interest are illustrated.)

FIG. 3 shows the repeated images of the original spectrum sampled at $f_1$, when it is upsampled by 4. FIG. 4 divides the upsampled spectrum into 5 equal pieces in preparation for downsampling by 5. The dotted lines indicate the boundaries of the 5 equal pieces, and the line marked N=5 corresponds to the new sampling frequency $f_2$. FIG. 5 shows images, which must be removed via filtering prior to downsampling, and the dash-dot line corresponds to the magnitude response of the filter used to remove the images. FIG. 6 shows the results after the filter removes the images. FIG. 7 shows the new spectrum with sampling rate $f_2$.

Thus, in a traditional design, such as illustrated in FIG. 1, a low-pass filter is required to remove the quantization noise produced by the delta-sigma ADC, and another filter may also be required to remove images as part of the sample rate conversion.

SUMMARY OF THE INVENTION

The present invention shows how to combine the two filters. Specifically, an Infinite Impulse Response (IIR) filter is provided that is sufficient to remove the quantization noise of the ADC, and that filter is modified to incorporate SRC image rejection. The internal states of the IIR filter are updated at the input data sample rate, while output data samples are created at the rate desired after sample rate conversion. In effect, the invention teaches how to calculate samples out of an IIR filter that are between, in time, the normal outputs of the filter.

Digital filtering and sample rate conversion blocks are combined in order to reduce hardware and/or computational complexity. Input data samples provided at a first sample rate are converted to output data samples at a second sample rate unequal to the first sample rate. An Infinite Impulse Response filter whose internal states are updated at the first sample rate filters the input data samples, to produce filtered data samples at the first sample rate. Output data samples are output at the second sample rate, where each output data sample is created as the sum of at least two intermediate products, a first intermediate product and a second intermediate product. The first intermediate product is defined by a first function of the internal states multiplied by a first function of the time difference between output samples and internal state updates, and the second intermediate product is defined by a second function of the internal states multiplied by a second function of the time difference between output samples and internal state updates.

The above description explains the fundamentals of a "clock-at-the-input-rate" SRC combined with an IIR filter. A single example is provided herein, which is derived with floating point numbers.

BRIEF DESCRIPTION OF THE DRAWINGS

FIG. 1 is a block diagram of a Prior Art ADC with Sample Rate Conversion provided as a separate block FIG. 2 is a block diagram illustrating the combined low-pass filter and sample rate conversion of the present invention.

DETAILED DESCRIPTION OF THE INVENTION

The present invention shows how to combine sample rate conversion with a low-pass IIR filter to form one compact design as illustrated in FIG. 2. FIG. 2 is a simplified block diagram of the present invention, illustrating how sample rate conversion may be combined with a low-pass filter in an Analog to Digital Converter (ADC). The low-pass filter removes out-of-band energy introduced by the delta-sigma modulator. Specific digital sampling frequencies are indicated via $f_1$ and $f_2$. Analog input 150 may be input to discrete-time analog Delta-Sigma ADC 160, outputting digital data at a first sampling frequency $f_1$. Combined digital low-pass filter and Sample Rate Converter (SRC) 170 may remove unwanted components from the digital data and output the digital data at a second (desired) sampling frequency $f_2$.

To implement the present invention, an IIR digital low-pass filter that is sufficient to remove quantization noise from the ADC modulator is designed. A calculation then derives an extension to the filter that creates output samples at times between the input samples, by removing alias images of the input sample rate. It is convenient to explain the derivation by means of an exemplary filter. The noise reduction digital filter is a third order IIR filter with the structure illustrated in FIG. 8.

Figure 8:
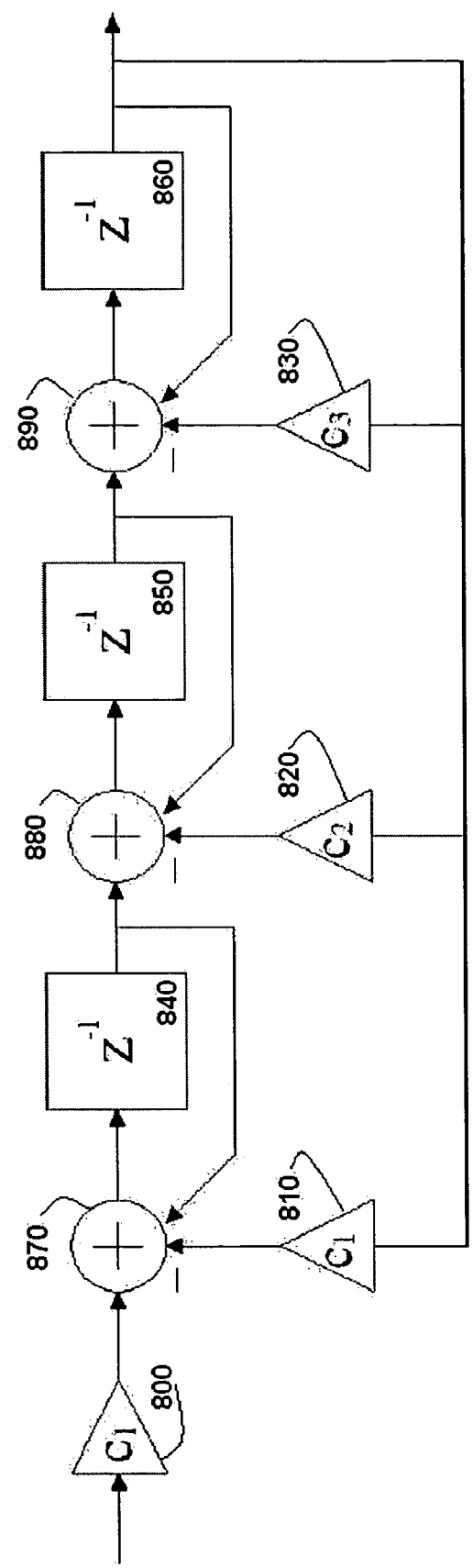
FIG. 8 is a block diagram of a third order IIR filter.

Referring to FIG. 8, each of blocks 840, 850, and 860 represent a unit memory delay (e.g., flip-flop). Blocks 800, 810, 820, and 830 represent filter coefficients. Elements 870, 880, 890 are adders, which add the feedback signals to the internal states, as modified by the corresponding filter coefficients. The output of each state is also fed back to the adder, and this "integrator topology" is chosen because it has good numerical behavior with fixed-point arithmetic in highly over-sampled, low-pass filters. A signal is input to one end of the filter and then is clocked through the flip-flops 840, 850, and 860, modified by the filter elements at each stage. The output signal represents the output of the filter.

In one embodiment, the coefficients $c_1$ 800,810, $c_2$ 820, and $c_3$ 830 in FIG. 8 may be chosen to provide a Butterworth response. By way of example, the sampling rate, $f_1$, is 6.75 MHz, and the 3 dB cutoff frequency is 25 KHz. The following set provides the desired response:

$c_1$=0.000012314

$c_2$=0.00107674

$c_3$=0.0465411

Figure 9:
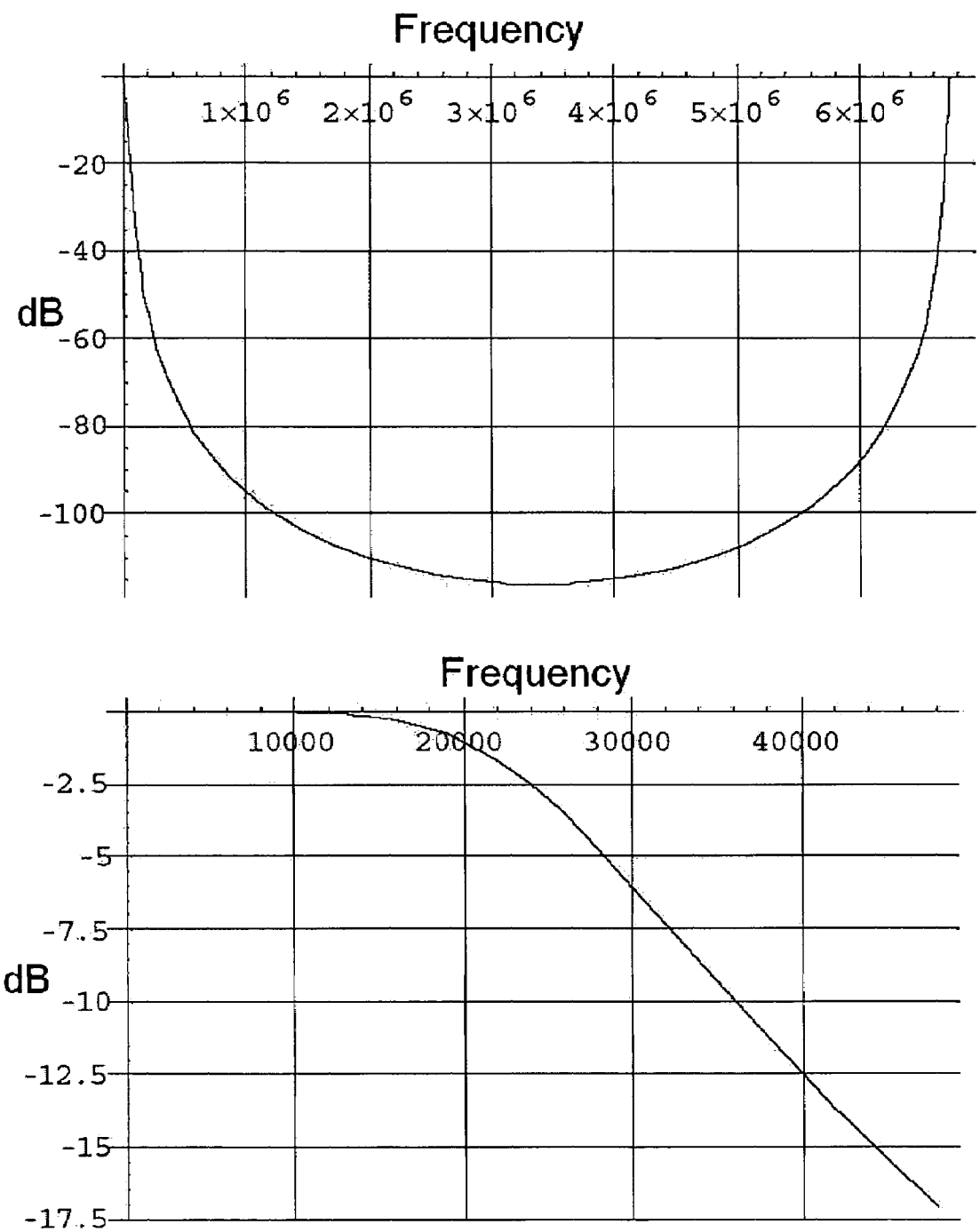
FIG. 9 is a plot of the magnitude response of the third order IIR low-pass filter.

FIG. 9 illustrates the squared magnitude response of the third order noise reduction filter, using the specific coefficients ci's listed above. The first plot runs from 0 to 6.75 MHz (which is $f_1$), and the second plot runs from 0 to 48 KHz for better viewing of the passband characteristics. The vertical axis is scaled in dB.

Figure 3:
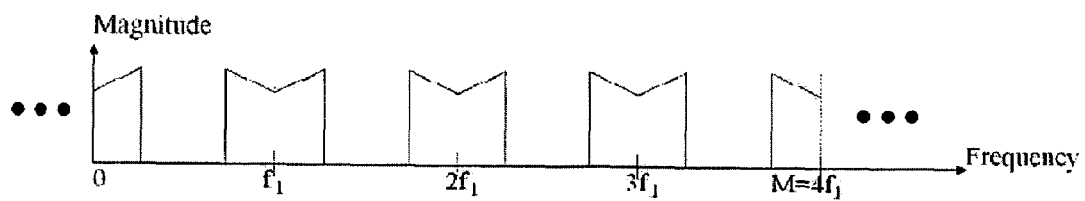
FIG. 3 is a frequency domain plot of the spectrum of data originally sampled at $f_1$, upsampled to $M=4f_1$.
Figure 4:
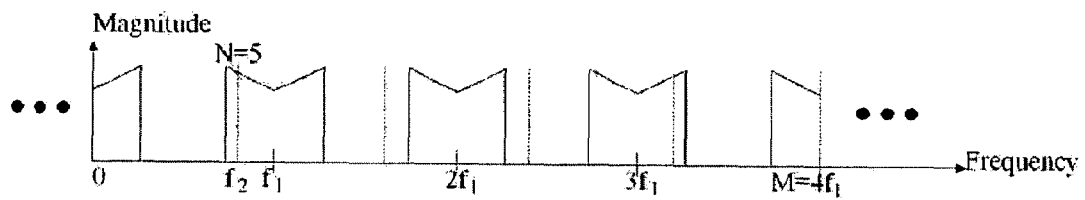
FIG. 4 is a frequency domain plot of the upsampled spectrum showing the N=5 downsampling frequency.
Figure 5:
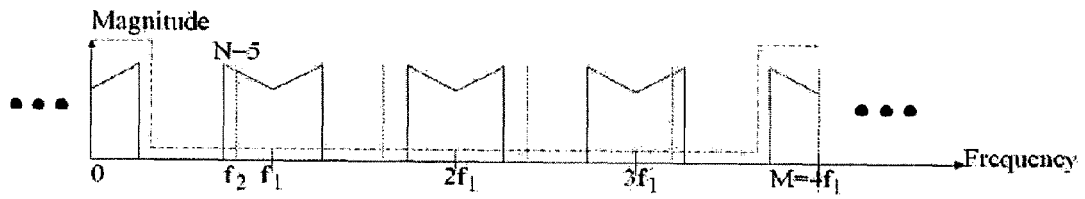
FIG. 5 is a frequency domain plot of the upsampled spectrum showing a low-pass filter to remove the images.
Figure 6:
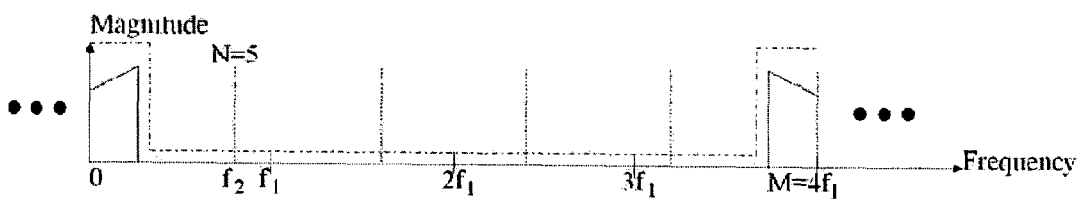
FIG. 6 is a frequency domain plot of the upsampled spectrum with the images removed via low-pass filtering.
Figure 7:
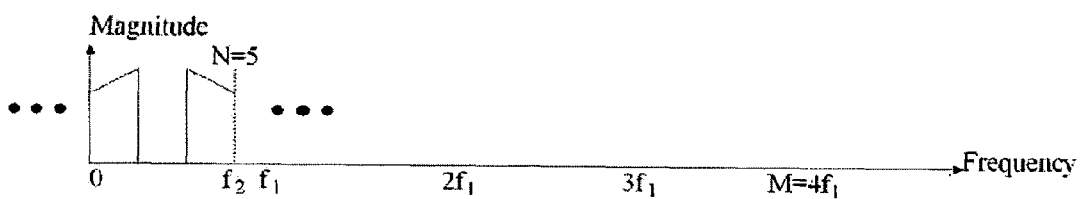
FIG. 7 is a frequency domain plot of the new spectrum after downsampling by N=5.

The spectrum in FIG. 9 corresponds to the spectrum of FIG. 3. In other words, it is the spectrum of the data coming out of the filter 130 in FIG. 1 (originally sampled at $f_1$), which one may desire to resample at frequency $f_2$. For the specific case when $f_2$=0.8 $f_1$, one can show this spectrum upsampled by 4 in preparation for downsampling by 5, as illustrated in FIG. 10.

Figure 10:
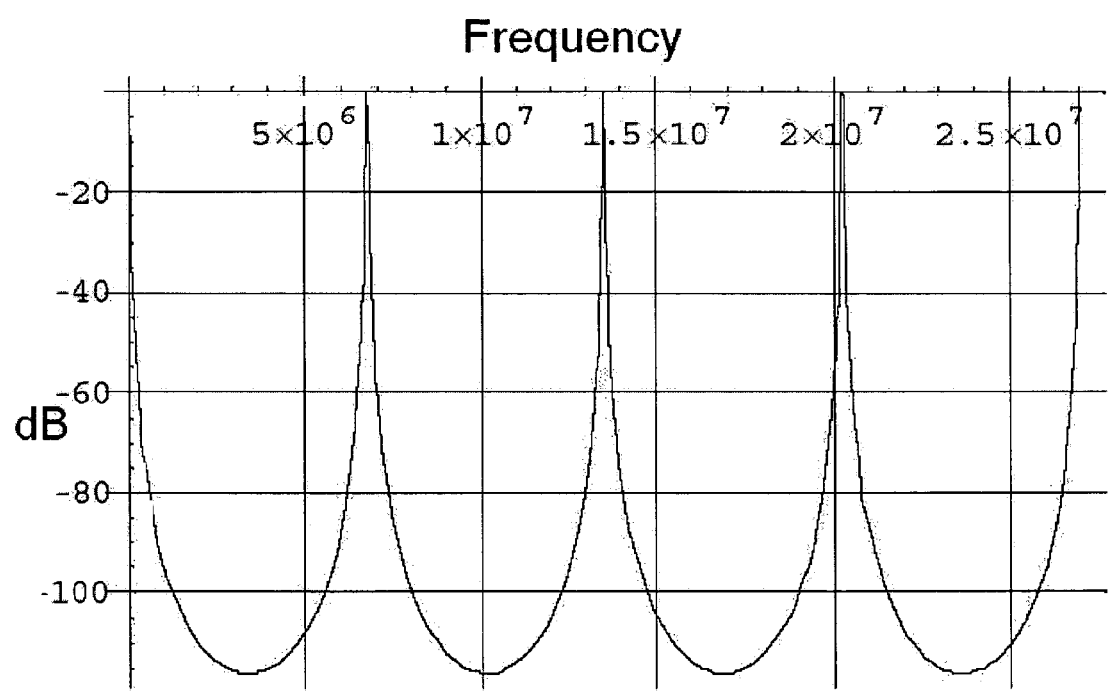
FIG. 10 is a plot of the spectrum of data upsampled by 4.

It would be advantageous to present a simple modification to the noise-reduction filter that would remove the spectral images in FIG. 10 in preparation for downsampling, thus completing the sample rate conversion operation. While this modification appears simple, the explanation behind it is complex. The following discussion of matrix fractional powers provides an explanation of how the noise reduction filter may be modified to remove spectral images.

In order to derive the filter modification needed to incorporate sample rate conversion into the noise-reduction low-pass filter, it is useful to discuss fractional powers of matrices. Specifically, the above third order low-pass filter is described by its internal state description as follows:

$$A = \begin{bmatrix} 1 & 0 & -c_1 \\ 1 & 0 & -c_2 \\ 0 & 1 & 1-c_3 \end{bmatrix}$$

$$B = \begin{bmatrix} c_1 \\ 0 \\ 0 \end{bmatrix}$$

$$C = \begin{bmatrix} 0 & 0 & 1 \end{bmatrix}$$

$$D = [0]$$

Figure 11:
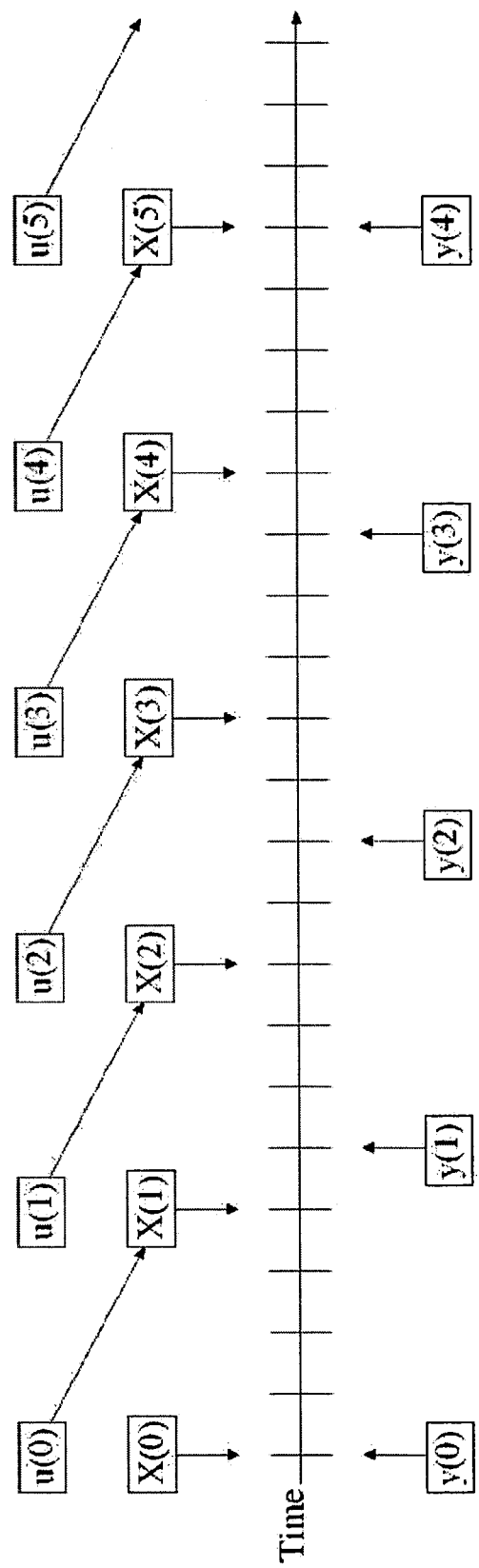
FIG. 11 is a diagram illustrating re-sampling u(k) at ⅘ the original rate.

A time-based representation of a 4/5 re-sampling operation is utilized. The x-axis in FIG. 11 represents time, and the top line indicates input samples, named u(k), at rate $f_1$, while the bottom line indicates output samples, named y(k), at rate $f_2$. The second line from the top indicates internal states which are updated from the above equations as:

$$X(k+1)=AX(k)+Bu(k)$$

Thus, as the slanting lines indicate, the X(k)'s are a function of the previous u(k)'s.

Internal states are updated synchronously with the incoming samples. Thus, this of sample rate conversion can be referred to as "clock at the input rate." This method contrasts with the method set forth in parent U.S. patent application Ser. No. 11/318,271 filed on Dec. 23, 2005, and incorporated herein by reference, which uses the output clock rate. Also, with respect to FIG. 11, since the re-sampled outputs are not synchronous with the internal states, the normal output equation $$y(k)=CX(k)+Du(k)$$

cannot be used unless intermediate states can be created at the times the outputs are desired. This situation is illustrated explicitly in FIG. 12.

Figure 12:
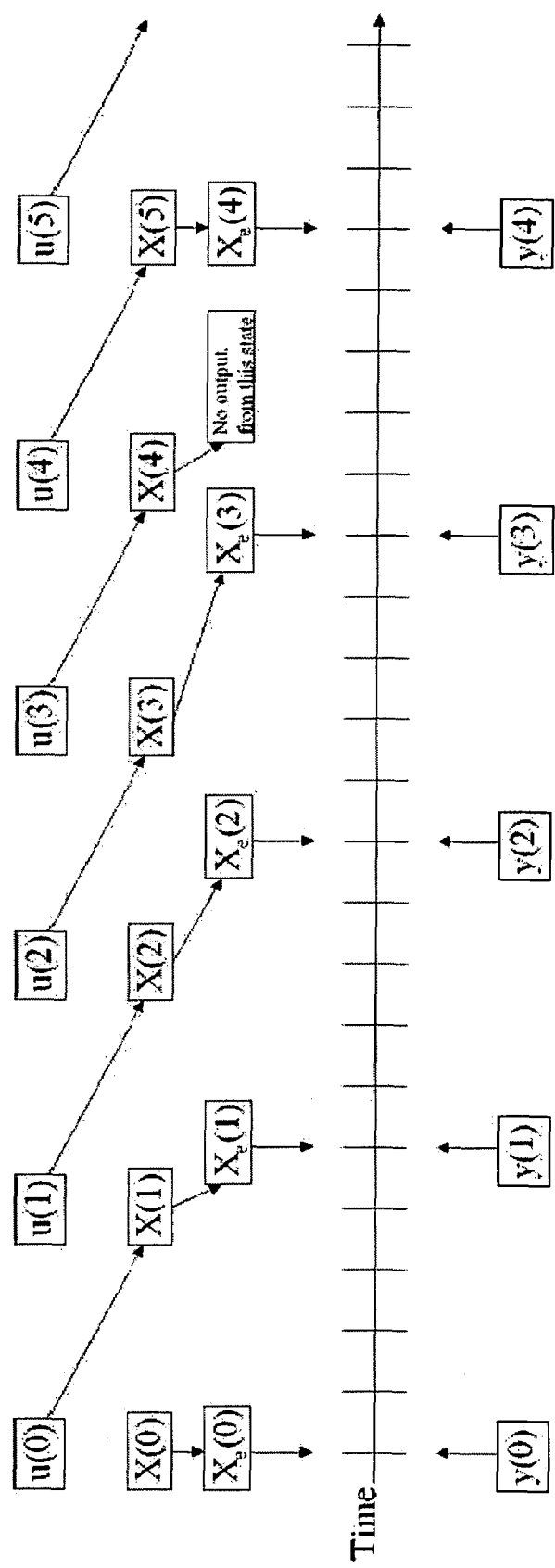
FIG. 12 is a diagram illustrating "effective states" required to produce re-sampled outputs.

From FIG. 12, outputs from the "effective" states ($X_e$(k)'s) can be produced as follows:

$$y(k)=CX_e(k)+Du(k)$$

The way to create the Xe(k)'s from the X(k)'s is to partially advance the state update equation. For example:

$$X_e(1)=A^{1/4}X(1)$$

$$X_e(2)=A^{2/4}X(2)$$

$$X_e(3)=A^{3/4}X(3)$$

Figure 13:
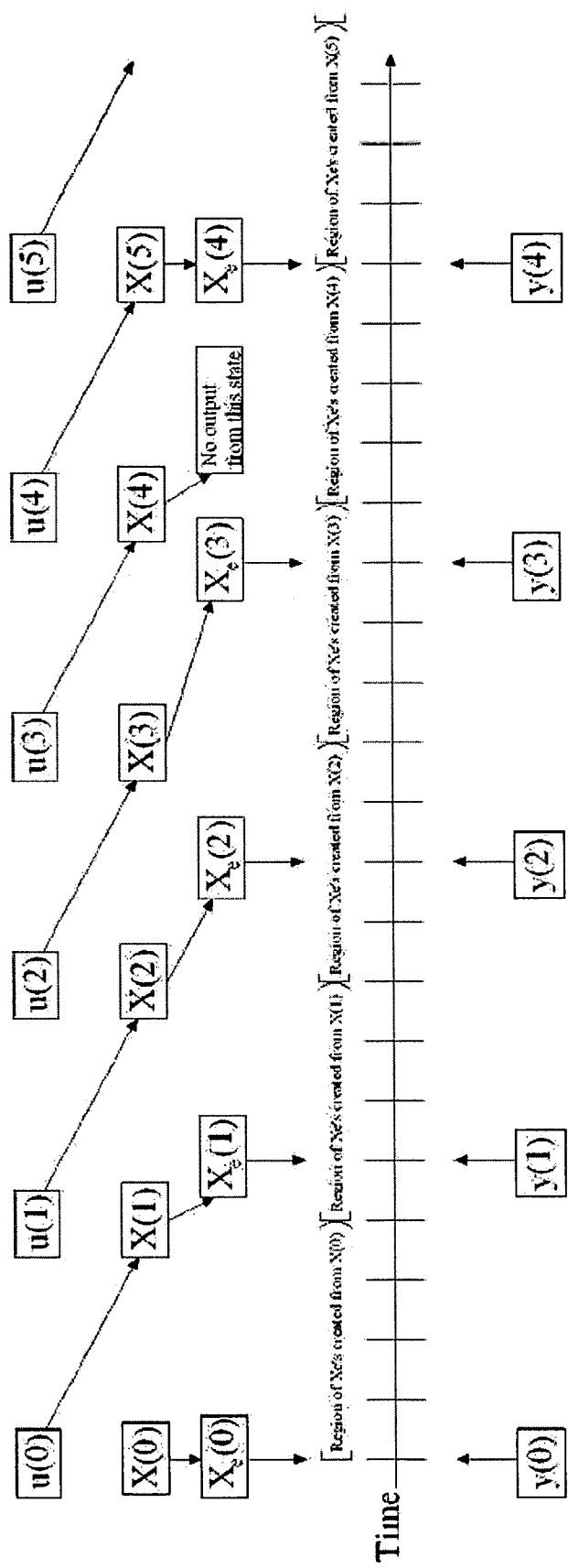
FIG. 13 is a diagram illustrating the regions of Xe(k) creation without centering.
Figure 14:
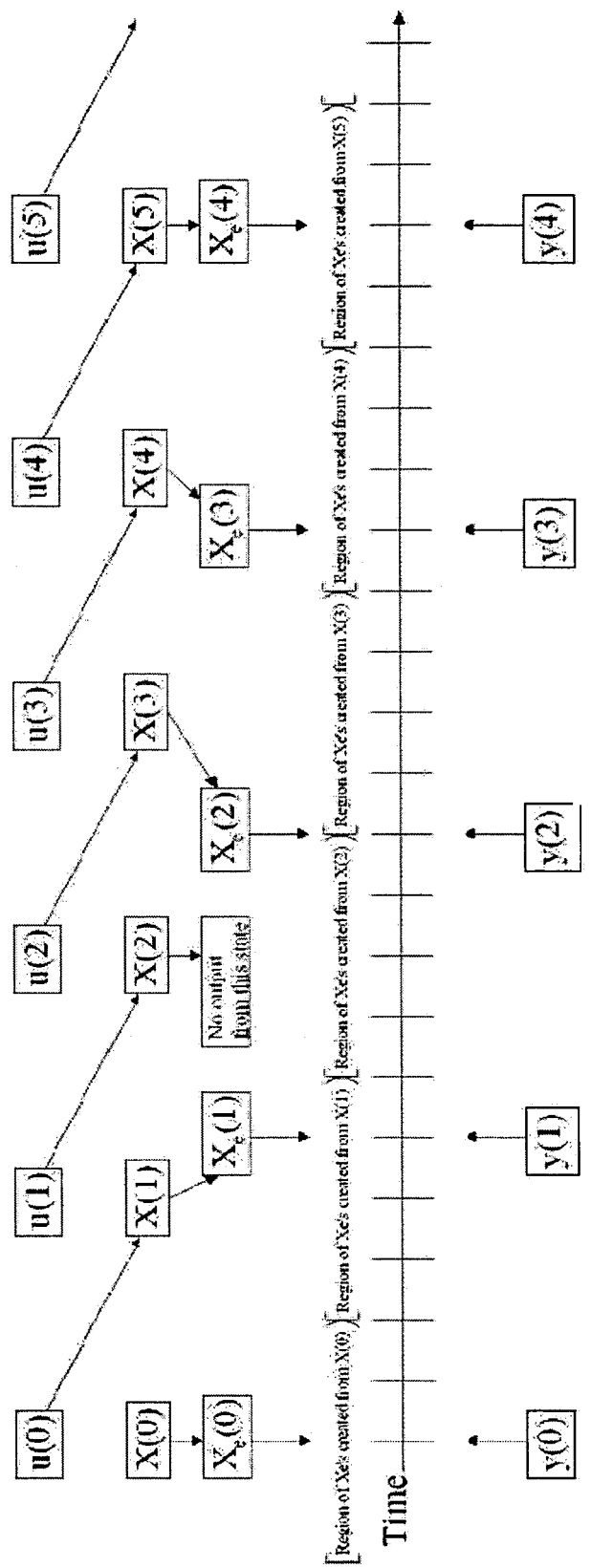
FIG. 14 is a diagram illustrating regions of Xe(k) creation with centering.

The powers of the A matrix, as shown above, can advance from 0 to just less than 1. It has been found advantageous to use powers between −½ and +½. This is referred to as centering the fractional delays. FIGS. 13 and 14 illustrate this centering concept.

The technique presented above is effective at sample rate conversion, but is computationally complex. A computational shortcut is needed.

Creating polynomial functions, which may be evaluated on-the-fly to give the same results as raising the matrix A to any fractional power, are now disclosed. First, consider that for most topologies, the matrix:

$$C=[0\ 0\ 1]$$

In other words, the output is taken from the last state, so that in the equation:

$$y(k)=CX_e(k)+Du(k)$$

The bottom element of $X_e(k)$ only needs to be examined. $X_e$ was formed as:

$$X_e(k)=A^{fp}X(k)$$

(where $0 \leq fp < 1$ for the non-centered case, and $-\frac{1}{2} \leq fp < \frac{1}{2}$ for the centered case).

Thus, the bottom row of $A^{fp}$ only needs to be examined in order to create the bottom element of $X_e$. A list of several $A^{fp}$'s is created, and the last row of each of them is examined:

$$A^{-\frac{3}{8}} = \begin{bmatrix} 1 & -3.29402 \times 10^{-6} & 4.76828 \times 10^{-6} \\ -0.374774 & 0.999715 & 0.0004133644 \\ 0.267501 & -0.387223 & 1.01774 \end{bmatrix}$$

$$A^{-\frac{1}{8}} = \begin{bmatrix} 1 & -8.94901 \times 10^{-7} & 1.580023 \times 10^{-6} \\ -0.124945 & 0.999922 & 0.00013728 \\ 0.0726733 & -0.128327 & 1.00589 \end{bmatrix}$$

$$A^{\frac{1}{8}} = \begin{bmatrix} 1 & 6.93345 \times 10^{-7} & -1.57106 \times 10^{-6} \\ 0.124962 & 1.00006 & -0.00013668 \\ -0.0563053 & 0.127583 & 0.994122 \end{bmatrix}$$

$$A^{\frac{3}{8}} = \begin{bmatrix} 0.999999 & 1.47999 \times 10^{-6} & -4.68578 \times 10^{-6} \\ 0.37493 & 1.00013 & -0.000408244 \\ -0.120188 & 0.380524 & 0.982419 \end{bmatrix}$$

Extracting just the last rows of each matrix yields the following matrix:

$$\begin{bmatrix} 0.267501 & -0.387223 & 1.01774 \\ 0.0726733 & -0.128327 & 1.00589 \\ -0.0563053 & 0.127583 & 0.994122 \\ -0.120188 & 0.380524 & 0.982419 \end{bmatrix}$$

In this last matrix, the third column is nearly constant, the second column is approximately linear, and the first column is nearly quadratic. These relationships will become even clearer with a larger list of fractional powers of A. For example, instead of just four matrices, with powers from $-\frac{3}{8}$ to $\frac{3}{8}$, 65 matrices with powers from $-\frac{64}{128}$ to $\frac{64}{128}$ spaced by $\frac{2}{128}$ may be utilized.

When such a table is created, and a least squares polynomial function fit is performed, the results are:

$$p_2(x)=0.389694-1.04128x+0.523788x^2$$

$$p_1(x)=-0.514816+1.02368x$$

$$p_0(x)=1.00007$$

where $p_2(x)$ is the curve fit through the first column, $p_1(x)$ is the curve fit through the second column, and $p_0(x)$ is the curve fit through the third column. These equations are scaled so that $0 \leq x < 1$ is the intended range for x. That is, $x = f_p + \frac{1}{2}$, since $f_p$ is in the range $-\frac{1}{2} \leq fp < \frac{1}{2}$. In these equations, x represents the time difference between input data samples and output data samples.

Once these equations are derived, they are used to generate the $X_e$'s at each step, instead of having to explicitly calculate a matrix fractional power. These equations create a good approximation of raising the A matrix to the proper fractional power at each step.

Figure 15:
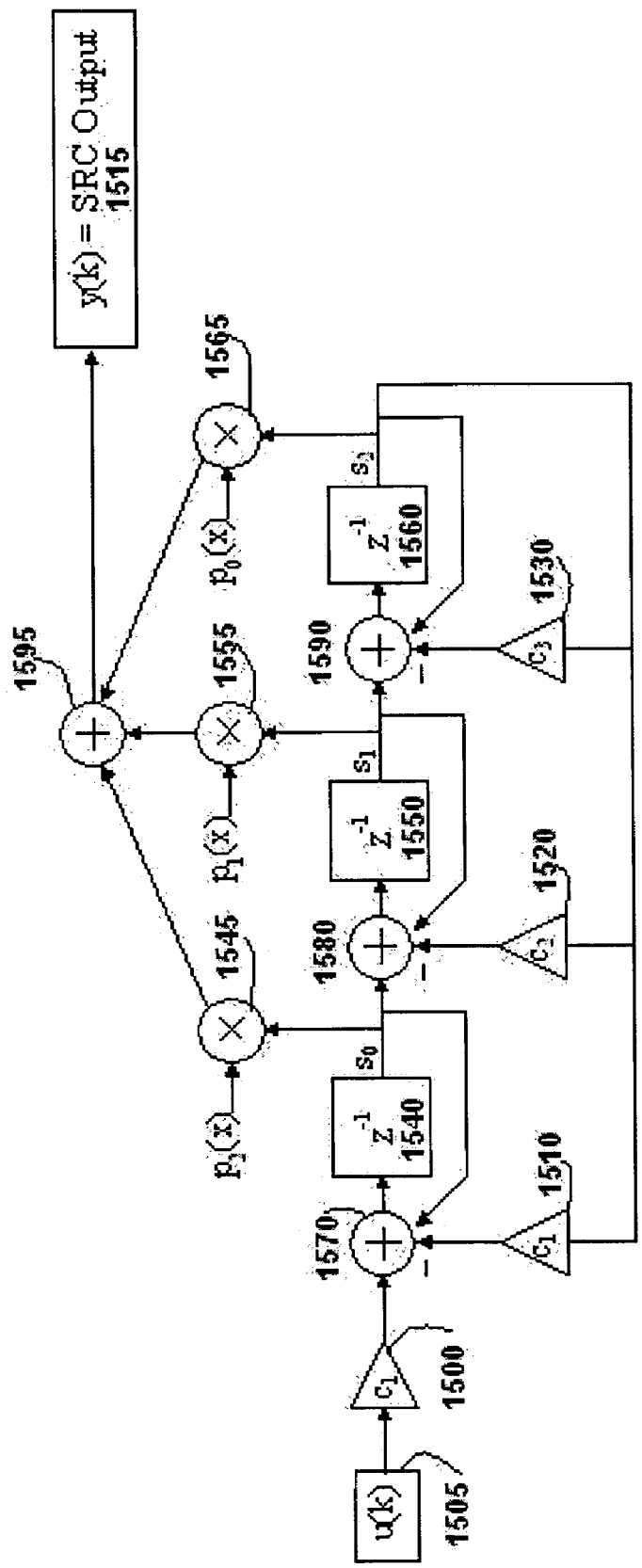
FIG. 15 is a block diagram of the SRC Output Filter Structure of the present invention.

FIG. 15 is a block diagram of the SRC Output Filter Structure of the present invention. Referring to FIG. 15, each of blocks 1540, 1550, and 1560 represent a unit memory delay (e.g., flip-flop). Blocks 1500, 1510, 1520, and 1530 represent filter coefficients. Elements 1570, 1580, 1590 are adders, which add the feedback signals to the internal states, as modified by the corresponding filter coefficients. The output of each state is also fed back to the adder, and this "integrator topology" is used because it has good numerical behavior with fixed-point arithmetic when used with highly over-sampled low pass filters. A signal u(k) 1505 is input to one end of the filter and then is clocked through the flip-flops 1540, 1550, and 1560, modified by the filter elements at each stage. The output of each stage is then fed to multipliers 1545, 1555, and 1565 which multiply the output at each stage by corresponding polynomial functions of x, as indicated. These values are then summed in adder 1595 to produce output y(k) 1515.

In general, it is desirable that a unity DC gain be preserved for all phase offsets. To preserve a unity gain for DC for the $3^{rd}$ order IIR filter in FIG. 15, the following must be true:

$$c_2p_2(x)+c_3p_1(x)+p_0(x)=1$$

To prove this, filter structure in FIG. 15 excited with an input value of 1. The filter output is:

$$c_2p_2(\text{x})+c_3p_1(\text{x})+p_0(\text{x})$$

For the $p_i(x)$'s generated above, the DC gain is:

$$0.97655+0.0465218x+0.000563979x^2$$

which demonstrates that as x varies between 0 and 1, the DC gain can vary quite a bit.

This variation is undesirable, and can be remedied by allowing all three polynomial functions to be of order 3, and enforcing the sum=1 by forcing the choice of one of the polynomial functions. This situation unfortunately increases the computation.

An alternate way to enforce unity DC gain is to perform a different polynomial function fit on the matrix entries. For example, for this specific filter, allowing all the $p_i(x)$'s to be quadratic produces the following results (where the i's in the $p_i(x)$'s no longer represent the order of the polynomial function, but instead just indicate placement in the filter topology of FIG. 15):

$$p_2(x)=0.389462-1.04082x+0.523785x^2$$

$$p_1(x)=-0.517788+1.04749x-0.0238212x^2$$

$$p_0(x)=1.02368-0.0476415x+0.000551117x^2$$

For these $p_i(x)$'s, the sum $$c_2p_2(x)+c_3p_1(x)+p_0(x)=1.0-0.0000110217x+6.43087 \times 10^{-6}x^2$$

which, while still a function of x, is not nearly as affected by x because the coefficients on x are relatively small.

A better way to solve this problem is by construction. The calculation can be re-arranged to guarantee the DC gain=1 constraint. With respect to FIG. 15, the output data samples are computed as $$y(k)=p_2(x)s_0+p_1(x)s_1+p_0(x)s_2$$

The above equation can be rewritten as $$y(k) = p_2(x)(s_0 - c_2 s_2 + c_2 s_2) + p_1(x)(s_1 - c_3 s_2 + c_3 s_2) + p_0(x) s_2$$
$$= p_2(x)(s_0 - c_2 s_2) + p_1(x)(s_1 - c_3 s_2) + [c_2 p_2(x) + c_3 p_1(x) + p_0(x)] s_2$$
$$= p_2(x)(s_0 - c_2 s_2) + p_1(x)(s_1 - c_3 s_2) + s_2$$

where the last line is true because it was previously shown that to preserve unity DC gain, $$c_2 p_2(x) + c_3 p_1(x) + p_0(x) = 1$$

Figure 16:
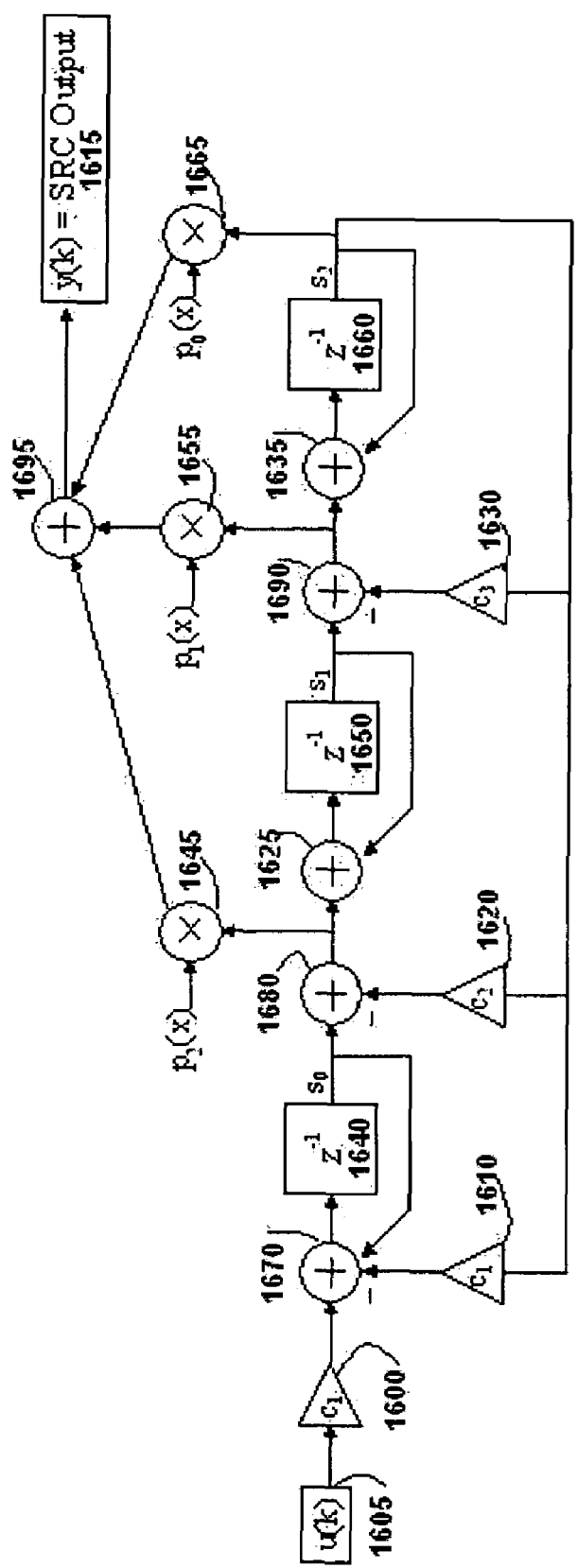
FIG. 16 is a block diagram of the preferred embodiment of the present invention.

FIG. 16 shows an IIR filter modified according to the above equations. This filter accomplishes sample rate conversion using the original derivations of the polynomial functions, while also forcing the DC gain to be unity by construction. Referring to FIG. 16, each of blocks 1640, 1650, and 1660 represent a unit memory delay (e.g., flip-flop). Blocks 1600, 1610, 1620, and 1630 represent filter coefficients. As in FIG. 15, an adder 1670 adds the feedback signal for the first stage to the internal state as modified by the corresponding filter coefficient. However, in FIG. 16, additional adders are provided for the subsequent stages in the filter. Adder 1680 adds the second filter coefficient 1620 to the output of the first stage 1640 to produce an intermediate value without the feedback value from the second stage 1650. The feedback value is added in a separate adder 1625. In a similar manner, the output of the second stage 1650 is fed to adder 1690 where it is added with the third coefficient value 1630 to produce a second intermediate value. Adder 1635 adds the feedback value from third stage 1660 as an input to that stage. A signal u(k) 1605 is input to one end of the filter and then is clocked through the flip-flops 1640, 1650, and 1660, modified by the filter elements at each stage. The two intermediate values from the first two stages and the output of the third stage are then fed to multipliers 1645, 1655, and 1665 which multiply the output at each stage by corresponding polynomial functions as indicated. These values are then summed in adder 1695 to produce output y(k) 1615.

Simulations show that enforcing unity DC gain is a critical part of getting good SRC performance. Without this constraint, SRC images are not sufficiently attenuated, and thus they create distortion in the output signal.

In conclusion, this invention demonstrates how to find a set of $p_i(x)$ functions, which may be applied to the states of a low-pass IIR filter, in order to create output samples at a rate different from the input samples. The set of $p_i(x)$ functions will vary depending on the particular filter to be modified, and also on the desired sample rate conversion performance. While the invention is based on fitting curves to the results of raising matrices to fractional powers, there are many ways to simplify the design without departing from its spirit. Ultimately, the desired SRC performance (image attenuation) will determine what simplifications can be made. For example, while the initial derivation suggests that the polynomial functions will be of increasing degree as applied from right to left across the IIR filter, the actual degrees of the polynomial functions need not follow this precisely. As shown above, it may make sense to increase the degree of the polynomial function to help preserve unity DC gain. Alternatively, it may make sense to decrease the degree of the polynomial function if the curve can be sufficiently approximated with a polynomial function of lower degree, and the resulting SRC performance is acceptable for the particular application. In fact, in some cases, one or more polynomial functions may be omitted entirely from the output data sample calculation if the desired SRC performance can be achieved without them. And finally, the polynomial functions may either be evaluated on-the-fly, or retrieved from a table without departing from the spirit of the invention.

While FIGS. 15 and 16 are described in connection with the polynomial functions p(x), other methods of implementing these embodiments may be applied without departing from the spirit and scope of the present invention. For example, in place of polynomial functions, a look-up table (LUT) may be provided with the p(x) values for given conditions. Thus, rather than execute the polynomial equations, look-up table values may be provided for these functions instead of polynomial functions. With a table-lookup, theses functions may not have to be polynomial functions, or at least not low order polynomial functions.

While the preferred embodiment and various alternative embodiments of the invention have been disclosed and described in detail herein, it may be apparent to those skilled in the art that various changes in form and detail may be made therein without departing from the spirit and scope thereof.

It should be noted that the examples illustrated herein should in no way be interpreted as limiting the spirit and scope of the present invention in any way. The specific examples and implementations are shown here for purposes of illustration only. While in the preferred embodiment the number of states in the filter may remain unaltered when modified to perform sample rate conversion, in alternative embodiments, additional states may be added without departing from the spirit and scope of the present invention.

We claim:

1. A method of converting input data samples provided at a first sample rate to output data samples at a second sample rate unequal to the first sample rate, the method comprising the steps of:

filtering the input data samples in an Infinite Impulse Response filter, the Infinite Impulse Response Filter having internal states updated at the first sample rate, to produce filtered data samples at the first sample rate; and outputting, at the second sample rate, output data samples, each output data sample created as the sum of at least two intermediate products, a first intermediate product and a second intermediate product, wherein the first intermediate product is defined by a first function of the internal states multiplied by a first function of the time difference between output samples and internal state updates, and the second intermediate product is defined by a second function of the internal states multiplied by a second function of the time difference between output samples and internal state updates.

2. The method of claim 1, wherein the first function of the time difference and the second function of the time difference are polynomial functions of the time difference.

3. The method of claim 1 wherein the Infinite Impulse Response filter is a low-pass filter, and the first function of the time difference and the second function of the time difference are functions created in response to raising a matrix representing the state transform of the Infinite Impulse Response filter to fractional powers.

4. The method of claim 3, wherein the first function of the time difference and the second function of the time difference are polynomial functions of the time difference which approximate the fractional matrix powers.

5. The method of claim 1, wherein the first function of the time difference and the second function of the time difference are calculated in real time by polynomial function approximations.

6. The method of claim 1, wherein the first function of the time difference and the second function of the time difference are pre-computed and their values are retrieved from a table lookup.

7. The method of claim 1, wherein the Infinite Impulse Response filter is incorporated into an Analog to Digital Converter decimation filter.

8. The method of claim 7, wherein the decimation filter follows a Delta-Sigma Analog to Digital Converter.

9. The method of claim 1, wherein the Infinite Impulse Response filter comprises a three stage filter having corresponding output values $s_0$, $s_1$, and $s_2$, wherein the output $y(k)$ of the Infinite Impulse response filter is defined as:

$$y(k)=p_2(x)(s_0-c_2s_2+c_2s_2)+p_1(x)(s_1-c_3s_2+c_3s_2)+p_0(x)s_2$$

where $p_0(x)$, $p_1(x)$, and $p_2(x)$ are polynomial function values, and $c_2$ and $c_3$ are filter coefficient values, and $s_0$, $s_1$, and $s_2$, are values of internal states of the filter.

10. The method of claim 9, wherein system DC response of the Infinite Impulse Response filter is approximately constant for all time offsets.

11. An apparatus of converting input data samples provided at a first sample rate to output data samples at a second sample rate unequal to the first sample rate, the apparatus comprising:
an Infinite Impulse Response filter having internal states updated at the first sample rate for filtering the input data samples to produce filtered data samples at the first sample rate; and
an output for outputting, at the second sample rate, output data samples, each output data sample created as the sum of at least two intermediate products, a first intermediate product and a second intermediate product,
wherein the first intermediate product is defined by a first function of the internal states multiplied by a first function of the time difference between output samples and internal state updates, and the second intermediate product is defined by a second function of the internal states multiplied by a second function of the time difference between output samples and internal state updates.

12. The apparatus of claim 11, wherein the first function of the time difference and the second function of the time difference are polynomial functions of the time difference.

13. The apparatus of claim 11, wherein the Infinite Impulse Response filter is a low-pass filter, and the first function of the time difference and the second function of the time difference are functions created in response to raising a matrix representing the state transform of the Infinite Impulse Response filter to fractional powers.

14. The apparatus of claim 13, wherein the first function of the time difference and the second function of the time difference are polynomial functions of the time difference, which approximate the fractional matrix powers.

15. The apparatus of claim 11, wherein the first function of the time difference and the second function of the time difference are calculated in real time by polynomial function approximations.

16. The apparatus of claim 11, wherein the first function of the time difference and the second function of the time difference are pre-computed and their values are retrieved from a table lookup.

17. The apparatus of claim 11, wherein the Infinite Impulse Response filter is incorporated into an Analog to Digital Converter decimation filter.

18. The apparatus of claim 17, wherein the decimation filter follows a Delta-Sigma Analog to Digital Converter.

19. The apparatus of claim 11, wherein the Infinite Impulse Response filter comprises a three stage filter having corresponding output values $s_0$, $s_1$, and $s_2$, wherein the output $y(k)$ of the Infinite Impulse response filter is defined as:

$$y(k)=p_2(x)(s_0-c_2s_2+c_2s_2)+p_1(x)(s_1-c_3s_2+c_3s_2)+p_0(x)s_2$$

where $p_0(x)$, $p_1(x)$, and $p_2(x)$ are polynomial function values, and $c_2$ and $c_3$ are filter coefficient values, and $s_0$, $s_1$, and $s_2$, are values of internal states of the filter.

20. The apparatus of claim 19, wherein system DC response of the Infinite Impulse Response filter is approximately constant for all time offsets.

* * * * *